(12) United States Patent
Sun et al.

(10) Patent No.: US 11,906,572 B2
(45) Date of Patent: Feb. 20, 2024

(54) TEST STRUCTURE AND TEST METHOD FOR ONLINE DETECTION OF METAL VIA OPEN CIRCUIT

(71) Applicant: Shanghai Huali Integrated Circuit Corporation, Shanghai (CN)

(72) Inventors: Shumiao Sun, Shanghai (CN); Zhigang Yang, Shanghai (CN); Qing Zhang, Beijing (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 3 days.

(21) Appl. No.: 17/861,974

(22) Filed: Jul. 11, 2022

(65) Prior Publication Data

US 2023/0069433 A1 Mar. 2, 2023

(30) Foreign Application Priority Data

Aug. 24, 2021 (CN) .......................... 202110973280.4

(51) Int. Cl.
*G01R 31/265* (2006.01)

(52) U.S. Cl.
CPC ................ *G01R 31/2653* (2013.01)

(58) Field of Classification Search
CPC .................................................. G01R 31/001
See application file for complete search history.

(56) References Cited

U.S. PATENT DOCUMENTS 9,490,292 B1 * 11/2016 Yap .................. H01L 27/14625
2021/0351088 A1 * 11/2021 Lee ................... H01L 21/67069

* cited by examiner

*Primary Examiner* — Tung X Nguyen
(74) *Attorney, Agent, or Firm* — Banner & Witcoff, Ltd.

(57) ABSTRACT

The present application provides a structure and method for online detection of a metal via open circuit, a contact layer is on the substrate, a first metal layer is on the contact layer, a first metal via layer is on the first metal layer, a second metal via layer is on the first metal via layer metal layer, the contact layer comprises a plurality of contacts, the plurality of contacts are connected to the first metal layer, the first metal via layer comprises a plurality of first vias, the plurality of first vias are filled with metal; detecting by means of an E-beam technology. A problem in the process can be found in advance, so as to solve the problem in time and thus stop losses as soon as possible.

8 Claims, 1 Drawing Sheet

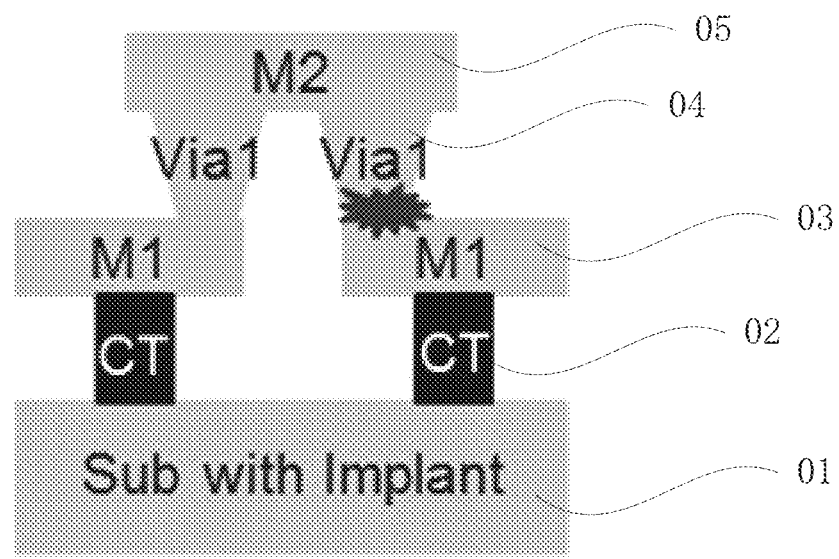

TEST STRUCTURE AND TEST METHOD FOR ONLINE DETECTION OF METAL VIA OPEN CIRCUIT

CROSS-REFERENCES TO RELATED APPLICATIONS

This application claims priority to Chinese patent application No. 202110973280.4, filed on Aug. 24, 2021, the disclosure of which is incorporated herein by reference in its entirety.

TECHNICAL FIELD

The present application relates to the technical field of semiconductors, in particular to a test structure and test method for online detection of a metal via open circuit.

BACKGROUND

With the reduction of semiconductor technology nodes, a back-end metal spacing becomes increasingly small, and the size of a via connecting upper and lower metal layers is confronted by the problem of high aspect ratio. In etching and filling of an extremely small via, there is a great challenge to the etching, and the subsequent via filling is also a serious challenge to the metal filling process. Any carelessness can easily lead to the problem of a via open circuit. Therefore, it is very important to find a way to quickly test the quality of the via, so as to find the problem as early as possible and thus alleviate the impact. In the conventional method, metal and a substrate in a via chain of a test structure directly form a suspended structure, that is, the metal is not connected to the substrate, and the filling problem of the detection via can only be found by testing the WAT, in which case the problem in the process cannot be found early, leading to a great impact.

BRIEF SUMMARY

In view of the above defect in the prior art, the objective of the present application is to provide a test structure and test method for online detection of a metal via open circuit, so as to solve the problem in the prior art that the filling of a via cannot be found in time due to the lack of direct connection between back-end metal and a substrate, resulting in an open circuit.

In order to achieve the above objective and other related objectives, the present application provides a test structure for online detection of a metal via open circuit, at least including:

a doped substrate; a contact layer on the substrate; a first metal layer on the contact layer; a first metal via layer on the first metal layer; and a second metal layer on the first metal via layer;

the contact layer including a plurality of contacts, the plurality of contacts being connected to the first metal layer; the first metal via layer including a plurality of first vias; the plurality of first vias being filled with metal, and the plurality of first vias being connected to the second metal layer.

In some examples, the substrate is a silicon substrate.

In some examples, the doped substrate is obtained by means of ion implantation.

In some examples, the contact layer includes two contacts.

In some examples, the first metal via layer includes two first vias.

In some examples, the test structure for online detection of a metal via open circuit further includes: a second metal via layer on the second metal layer; a third metal layer on the second metal via layer; a third metal via layer on the third metal layer; and a fourth metal layer on the third metal via layer.

In some examples, the second metal via layer includes a plurality of second vias, the second vias being connected to the third metal layer; and the third metal via layer includes a plurality of third vias, the plurality of third vias being connected to the fourth metal layer.

The preset application further provides a test method of the text structure for online detection of a metal via open circuit, including:

step 1, providing the test structure; and step 2, detecting, by means of an E-beam technology, whether metal filling in the first via produces an open circuit.

In an example, step 2 of detecting, by means of an E-beam technology, whether metal filling in the first via produces an open circuit is: observing brightness and darkness of the first metal layer and the second metal layer to determine whether the metal filling in the first via produces an open circuit.

As stated above, the test structure for online detection of a metal via open circuit and the test method of the preset application have the following beneficial effects: the present application is based on the conventional back-end test structure via chain, the contact layer is added between the metal layer and the substrate and connected to the metal layer, and a filling situation of the bottom of the metal via is detected by means of an online E-beam method, so as to find a problem in the process in advance, solve the problem in time, and thus stop losses as soon as possible.

BRIEF DESCRIPTION OF THE DRAWINGS

FIG. 1 illustrates a schematic diagram of a test structure for online detection of a metal via open circuit of the preset application.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Please refer to FIG. 1. It should be noted that the drawing provided in this embodiment is only used to illustrate the basic concept of the present application in a schematic way, so the drawing only shows the components related to the present application rather than being drawn according to the number, shape and size of the components in actual implementation. The type, number and proportion of various components can be changed randomly during actual implementation, and the layout of components may be more complicated.

The present application provides a test structure for online detection of a metal via open circuit, at least including:

a doped substrate; a contact layer on the substrate; a first metal layer on the contact layer; a first metal via layer on the first metal layer; and a second metal layer on the first metal via layer.

The contact layer includes a plurality of contacts, the plurality of contacts being connected to the first metal layer. The first metal via layer includes a plurality of first vias. The plurality of first vias are filled with metal, and the plurality of first vias are connected to the second metal layer.

Referring to FIG. 1, FIG. 1 is a schematic diagram of the test structure for online detection of a metal via open circuit of the preset application. The test structure of the preset application includes: the doped substrate (sub with implant) 01; the contact layer 02 on the substrate 01; the first metal layer 03 on the contact layer 02; the first metal via layer 04 on the first metal layer 03; and the second metal layer on the first metal via layer 04.

The contact layer 02 includes a plurality of contacts CTs, the plurality of contacts CTs being connected to the first metal layer 03. The first metal via layer 04 includes a plurality of first vias. The plurality of first vias are filled with metal, and the plurality of first vias are connected to the second metal layer 05.

In this embodiment of the present application, the substrate is a silicon substrate.

In this embodiment of the present application, the doped substrate is obtained by means of ion implantation.

In this embodiment of the present application, the contact layer includes two contacts.

In this embodiment of the present application, the first metal via layer includes two first vias.

The test structure of the present application further includes: a second metal via layer on the second metal layer; a third metal layer on the second metal via layer; a third metal via layer on the third metal layer; and a fourth metal layer on the third metal via layer.

In this embodiment of the present application, the second metal via layer includes a plurality of second vias, the second vias being connected to the third metal layer; and the third metal via layer includes a plurality of third vias, the plurality of third vias being connected to the fourth metal layer.

The preset application further provides a test method of the text structure for online detection of a metal via open circuit, including the following steps:

Step 1. The test structure is provided.

Step 2. Detection as to whether metal filling in the first via produces an open circuit is performed by means of an E-beam technology.

In this embodiment of the present application, step 2 of detecting, by means of an E-beam technology, whether metal filling in the first via produces an open circuit is: observing brightness and darkness of the first metal layer and the second metal layer to determine whether the metal filling in the first via produces an open circuit. That is, after an electron beam is shot onto the test structure and observation is performed on the topmost metal layer, a brighter metal layer indicates a better metal filling effect in the corresponding via, and a darker metal layer indicates a worse metal filling effect in the corresponding via.

To sum up, the present application is based on the conventional back-end test structure via chain, the contact layer is added between the metal layer and the substrate and connected to the metal layer, and a filling situation of the bottom of the metal via is detected by means of an online E-beam method, so as to find a problem in the process in advance, solve the problem in time, and thus stop losses as soon as possible. Therefore, the present application effectively overcomes various defects in the prior art and has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A test structure for online detection of a metal via open circuit, comprising:
   a doped substrate;
   a contact layer on the doped substrate;
   a first metal layer on the contact layer;
   a first metal via layer on the first metal layer;
   a second metal layer on the first metal via layer;
   a second metal via layer on the second metal layer;
   a third metal layer on the second metal via layer;
   a third metal via layer on the third metal layer; and
   a fourth metal layer on the third metal via layer,
   wherein the contact layer comprises a plurality of contacts, the plurality of contacts being connected to the first metal layer, the first metal via layer comprises a plurality of first vias, the plurality of first vias being filled with metal, and the plurality of first vias being connected to the second metal layer.

2. The test structure for online detection of the metal via open circuit according to claim 1, wherein the doped substrate is a silicon substrate.

3. The test structure for online detection of the metal via open circuit according to claim 1, wherein the doped substrate is obtained by means of ion implantation.

4. The test structure for online detection of the metal via open circuit according to claim 1, wherein the contact layer comprises two contacts.

5. The test structure for online detection of the metal via open circuit according to claim 1, wherein the first metal via layer comprises two first vias.

6. The test structure for online detection of the metal via open circuit according to claim 1, wherein the second metal via layer comprises a plurality of second vias, the second vias being connected to the third metal layer; and the third metal via layer comprises a plurality of third vias, the plurality of third vias being connected to the fourth metal layer.

7. A test method of the test structure for online detection of the metal via open circuit according to claim 1, comprising:
   step 1, providing the test structure; and
   step 2, detecting, by means of an E-beam technology, whether metal filling in the first via produces an open circuit.

8. The test method of the test structure for online detection of the metal via open circuit according to claim 7, wherein the detecting, by means of the E-beam technology, whether metal filling in the first via produces the open circuit comprises observing brightness and darkness of the first metal layer and the second metal layer to determine whether the metal filling in the first via produces an open circuit.

* * * * *